(12) United States Patent
Hu et al.

(10) Patent No.: US 11,889,743 B2
(45) Date of Patent: Jan. 30, 2024

(54) EVAPORATION METHOD, EVAPORATION MASK ASSEMBLY, DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xuwu Hu, Beijing (CN); Yangsheng Liu, Beijing (CN); Mengxia Kong, Beijing (CN); Donghui Si, Beijing (CN); Shan Mou, Beijing (CN); Yan Cui, Beijing (CN); Yu Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 523 days.

(21) Appl. No.: 16/960,672

(22) PCT Filed: Dec. 25, 2019

(86) PCT No.: PCT/CN2019/128286
§ 371 (c)(1),
(2) Date: Jul. 8, 2020

(87) PCT Pub. No.: WO2020/151448
PCT Pub. Date: Jul. 30, 2020

(65) Prior Publication Data
US 2021/0217955 A1 Jul. 15, 2021

(30) Foreign Application Priority Data
Jan. 22, 2019 (CN) .......................... 201910057935.6

(51) Int. Cl.
C23C 14/04 (2006.01)
C23C 14/24 (2006.01)
(Continued)

(52) U.S. Cl.
CPC ......... *H10K 71/166* (2023.02); *C23C 14/042* (2013.01); *C23C 14/24* (2013.01);
(Continued)

(58) Field of Classification Search
CPC ....... C23C 14/042; C23C 14/24; H10K 50/11; H10K 50/15; H10K 50/16; H10K 71/00; H10K 71/164; H10K 71/166
See application file for complete search history.

(56) References Cited

U.S. PATENT DOCUMENTS

| 9,682,400 | B2 * | 6/2017 | Kim ...................... C23C 14/042 |
| 2004/0099863 | A1 * | 5/2004 | Chen ................... H01L 27/1255 257/E27.113 |

(Continued)

FOREIGN PATENT DOCUMENTS

| CN | 106435483 A | 2/2017 |
| CN | 107236927 A | 10/2017 |

(Continued)

OTHER PUBLICATIONS

First Office Action dated Jan. 6, 2020, relating to CN Patent Application No. 201910057935.6.

(Continued)

*Primary Examiner* — Omar F Mojaddedi
(74) *Attorney, Agent, or Firm* — DINSMORE & SHOHL LLP

(57) ABSTRACT

The present disclosure discloses an evaporation method, an evaporation mask assembly, a display panel and a display device, which can reduce the complexity of the manufacturing process of the display panel and improve the yield of the display panel. The evaporation method may comprise: performing a first evaporation on a base substrate by using a first mask to form a first evaporation sub-pattern on the base substrate, wherein the first mask has a first opening area; and performing a second evaporation on the base substrate by using a second mask to form a second evaporation sub-pattern on the base substrate, wherein the second (Continued)

mask has a second opening area; wherein the combination of the first and second evaporation sub-patterns forms an evaporation pattern.

12 Claims, 8 Drawing Sheets

(51) Int. Cl.
*H10K 71/16* (2023.01)
*H10K 71/00* (2023.01)
*H10K 50/11* (2023.01)
*H10K 50/15* (2023.01)
*H10K 50/16* (2023.01)

(52) U.S. Cl.
CPC ........... *H10K 71/00* (2023.02); *H10K 71/164* (2023.02); *H10K 50/11* (2023.02); *H10K 50/15* (2023.02); *H10K 50/16* (2023.02)

(56) References Cited

U.S. PATENT DOCUMENTS

| | | | |
|---|---|---|---|
| 2010/0221919 A1* | 9/2010 | Lee | H01L 21/3086 438/694 |
| 2012/0040528 A1* | 2/2012 | Kim | H01L 21/0337 257/E21.585 |
| 2013/0192521 A1* | 8/2013 | Chu | C23C 14/042 118/504 |
| 2015/0287922 A1* | 10/2015 | Chen | C23C 14/042 118/727 |
| 2020/0357998 A1* | 11/2020 | Bai | H01L 51/5203 |
| 2021/0336146 A1* | 10/2021 | Liu | C23C 14/547 |

FOREIGN PATENT DOCUMENTS

| | | |
|---|---|---|
| CN | 107779818 A | 3/2018 |
| CN | 107829065 A | 3/2018 |
| CN | 108866476 A | 11/2018 |
| CN | 109306448 A | 2/2019 |
| CN | 109326225 A | 2/2019 |
| CN | 109554665 A | 4/2019 |
| EP | 2298952 B1 | 6/2014 |
| WO | 2015043303 A1 | 4/2015 |

OTHER PUBLICATIONS

Second Office Action dated Jul. 13, 2020, relating to CN Patent Application No. 201910057935.6.

Notice to Grant dated Oct. 27, 2020, relating to CN Patent Application No. 201910057935.6.

\* cited by examiner

EVAPORATION METHOD, EVAPORATION MASK ASSEMBLY, DISPLAY PANEL AND DISPLAY DEVICE

CROSS-REFERENCE TO RELATED APPLICATIONS

This application claims priority under 35 U.S.C. § 371 to International Patent Application No. PCT/CN2019/128286 filed on Dec. 25, 2019, which claims the priority of the Chinese application 201910057935.6 filed on Jan. 22, 2019, and the entire content of the Chinese application is incorporated herein by reference.

TECHNICAL FIELD

The present disclosure relates to the field of display technology, and in particular, to an evaporation method, an evaporation mask assembly, a display panel, and a display device.

BACKGROUND

At present, display panels with full-screen design are getting more and more popular among consumers because of their relatively higher Screen-to-body Ratio. The full-screen is usually designed with ultra-narrow borders, and a light-transmitting area set in the display region (or Active Area, AA). The light-transmitting area is used for placing components such as cameras and earpieces.

At present, in the light-transmitting area, the film layer of the display panel may need to be digged, that is, the film layer is first arranged on a base substrate, and then digged in a manner such as laser or etching. The laser or etching process is more complicated and equipment requirements are greater. The laser cutting of the film layer may damage the film layer, resulting in a decrease in the yield of the display panel, and the etching will bring about particle pollution.

SUMMARY

Embodiments of the present disclosure provide an evaporation method, an evaporation mask assembly, a display panel, and a display device, which can reduce the complexity of manufacturing process of the display panel and improve the yield rate of the display panel.

In a first aspect, an embodiment of the present disclosure provides an evaporation method. The evaporation method comprises:

using opening areas of at least two mask in sequence to perform evaporation on a base substrate, and evaporation sub-patterns formed on the base substrate by each of the opening areas of the masks constitute complementary patterns, and an evaporation pattern formed by stitching each of the evaporation sub-patterns corresponds to a display region having an isolated hollow pattern.

In embodiments of the present disclosure, evaporations on the base substrate are performed by adopting the opening areas of the at least two masks in sequence, wherein the evaporation sub-patterns formed on the base substrate by each of opening areas of the masks constitute complementary patterns, and the complementary patterns correspond to the display region having the isolated hollow pattern, thus achieving the purpose of forming a light-transmitting area on the display panel without adding a process, and reducing the complexity of the manufacturing process of the display panel.

In a possible implementation, when the evaporations are performed on the base substrate by using the opening areas of the at least two masks in sequence, evaporation angles of an evaporation source corresponding to each mask are different.

In embodiments of the present disclosure, when the evaporations are performed on the base substrate by using the opening areas of the at least two masks, in order to avoid that the materials deposited at the edges where the at least two masks intersect are thicker, angles between the evaporation source and the masks are adjusted to ensure that the thicknesses of the deposited material are consistent.

In a second aspect, an embodiment of the present disclosure provides an evaporation mask assembly including at least two masks, wherein each of the masks is provided with a plurality of opening areas arranged in an array and corresponding to the display region in a one-to-one correspondence, wherein opening areas corresponding to a same opening area constitute complementary patterns, and the pattern formed by stitching respective opening areas corresponds to the display region having an isolated hollow pattern.

In a possible implementation, the mask comprises a first mask and a second mask; the first mask has a first type of opening area corresponding to the display region in a one-to-one correspondence, the second mask has a second type of opening area corresponding to the display region in a one-to-one correspondence, the first type of opening area and the second type of opening area corresponding to a same opening area constitute complementary patterns, and the pattern formed by stitching respective opening areas corresponds to a display region having the isolated hollow pattern.

In a possible implementation, thicknesses of the first type of opening area and the second type of opening area corresponding to a same opening area at adjacent edges are greater than thicknesses thereof at other edges.

In a possible implementation, the first type of opening areas and the second type of opening areas corresponding to a same opening area have opposite patterns.

In a third aspect, an embodiment of the present disclosure provides a display panel including a base substrate and a evaporation film layer formed on the base substrate, wherein the evaporation film layer is formed with the evaporation method described in any one of the first aspect.

In a possible implementation, the evaporation film layer comprises: a light-emitting layer, an electron transport layer, or a hole transport layer.

In a possible implementation, the evaporation film layer has at least one isolated hollow pattern.

According to a fourth aspect, an embodiment of the present disclosure provides a display device including the display panel according to any one of the third aspect.

In embodiments of the present disclosure, evaporations on the base substrate are performed by adopting the opening areas of the at least two masks in sequence, wherein the evaporation sub-patterns formed on the base substrate by each of the opening areas of the masks constitute complementary patterns, and the complementary patterns correspond to the display region having the isolated hollow pattern, thus achieving the purpose of forming a light-transmitting area on the display panel without adding a process, and reducing the complexity of the manufacturing process of the display panel.

According to an aspect of the present disclosure, there is provided an evaporation method, comprising: performing a first evaporation on a base substrate by using a first mask to form a first evaporation sub-pattern on the base substrate, wherein the first mask has a first opening area; and performing a second evaporation on the base substrate by using a second mask to form a second evaporation sub-pattern on the base substrate, wherein the second mask has a second opening area; wherein the combination of the first and second evaporation sub-patterns forms an evaporation pattern.

In some embodiments, the first and second evaporation sub-patterns constitute complementary patterns.

In some embodiments, the evaporation pattern formed by the combination of the first and second evaporation sub-patterns corresponds to a display region having the isolated hollow pattern.

In some embodiments, a vertical projection of the first mask on the base substrate when the first evaporation is performed and a vertical projection of the second mask on the base substrate when the second evaporation is performed have overlapping portions, the overlapping portions are associated with the first opening area and the second opening area respectively.

In some embodiments, the evaporation pattern formed by the combination of the first and second evaporation sub-patterns has an isolated opening, and at least a part of the isolated opening corresponds to the overlapping portions.

In some embodiments, an evaporation angle of an evaporation source corresponding to the first mask when the first evaporation is performed is different from the evaporation angle of the evaporation source corresponding to the second mask when the second evaporation is performed.

In some embodiments, the evaporation method further comprises: performing a third evaporation on the base substrate with a third mask to form a third evaporation sub-pattern on the base substrate, wherein the third mask has a third opening area; wherein the combination of the first, second and third evaporation sub-patterns forms the evaporation pattern.

According to an aspect of the present disclosure, there is provided an evaporation mask assembly including at least two masks, wherein each of the masks is provided with at least one opening area, wherein corresponding opening areas of the at least two masks constitute complementary patterns, and the combination of the corresponding opening areas of the at least two masks can be used to form an evaporation layer having an isolated hollow pattern.

In some embodiments, the at least two masks comprise a first mask and a second mask; the first mask has a first opening area, and the second mask has a second opening area corresponding to the first opening area, the first opening area and the second opening area constitute complementary patterns, and the combination of the first opening area and the second opening area can be used to form an evaporation layer having the isolated hollow pattern.

In some embodiments, a thickness of each of the corresponding opening areas of the at least two masks at edges adjacent to each other is greater than thickness thereof at other edges.

In some embodiments, the corresponding first opening area and the second opening area have opposite patterns.

In some embodiments, the evaporation mask assembly is configured such that when the evaporation mask assembly is used to perform evaporations on a base substrate, a vertical projection of the first mask on the base substrate and a vertical projection of the second mask on the base substrate have overlapping portions, and the overlapping portions are associated with the first opening and the second opening area respectively.

In some embodiments, the overlapping portions are such that the evaporation pattern formed by performing the evaporations on the base substrate by using the evaporation mask assembly has an isolated opening.

According to an aspect of the present disclosure, there is provided a display panel comprising a base substrate and a evaporation film layer formed on the base substrate, wherein the evaporation film layer is formed by adopting the evaporation method according to any of the embodiments described.

In some embodiments, the evaporation film layer comprises one or more of: a light emitting layer, an electron transport layer, or a hole transport layer.

In some embodiments, the evaporation film layer has at least one isolated hollow pattern.

According to an aspect of the present disclosure, there is provided display device comprising the display panel according to any of the embodiments described.

DETAILED DESCRIPTION

Figure 1:
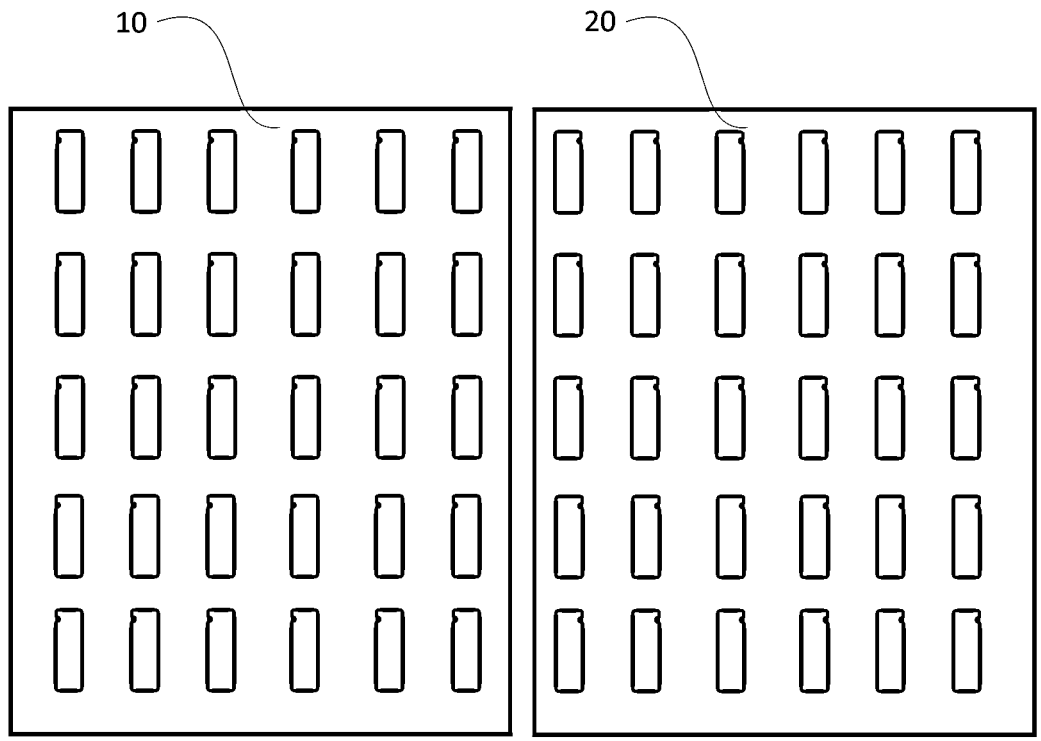
FIG. 1 is a schematic structural diagram of a mask assembly provided by an embodiment of the present disclosure.

To make the objectives, technical solutions, and advantages of the present disclosure more clear, the technical solutions in embodiments of the present disclosure will be described clearly and completely in conjunction with the drawings in embodiments of the present disclosure.

The specific implementation of the evaporation method, the evaporation mask assembly, the display panel, and the display device provided by embodiments of the present disclosure will be described in detail below with reference to the drawings.

The thickness and shape of each film layer in the drawings do not reflect the true ratio, and the purpose is only to illustrate the disclosure.

An embodiment of the present disclosure provides an evaporation method. When the evaporation method is specifically executed, opening areas provided in at least two masks are used in sequence to perform evaporations on a base substrate. That is, the first mask is used to form an evaporation sub-pattern corresponding to the opening area of the first mask on the base substrate through a evaporation process, and then the second mask or other masks are continued to be used to forma partial evaporation sub-pattern on the base substrate through multiple evaporation processes, thereby forming an evaporation pattern on the base substrate.

In embodiments of the present disclosure, the evaporation sub-patterns formed on the base substrate by the opening areas of respective masks constitute complementary patterns, and the evaporation pattern formed by stitching the evaporation sub-patterns corresponds to a display region having an isolated hollow pattern. The isolated hollow pattern can correspond to the light-transmitting area of the display panel, thereby achieving the purpose of forming the light-transmitting area on the display panel without adding a process, and reducing the complexity of the manufacturing process of the display panel.

Since in embodiments of the present disclosure, the evaporation patterns formed on the base substrate constitute complementary patterns formed by the evaporation sub-patterns formed on the base substrate through the opening areas of the respective masks, in the specific evaporation process, the area on the base substrate to be evaporated is masked only once in the evaporation process, and the area which should be blocked are masked both, that is, masked twice, which may result in the thickness of the material deposited at the adjacent edges of the first type of opening area and the second type of opening area corresponding to a same opening area may be thicker than that of the other areas. For this reason, in embodiments of the present disclosure, when the evaporation is performed on the base substrate by using the opening areas of at least two masks in sequence, the evaporation angle between an evaporation source and each mask can be adjusted so that the evaporation source corresponding to respective masks have different evaporation angles, so as to ensure the thickness of the evaporated material is uniform as much as possible.

Figure 2:
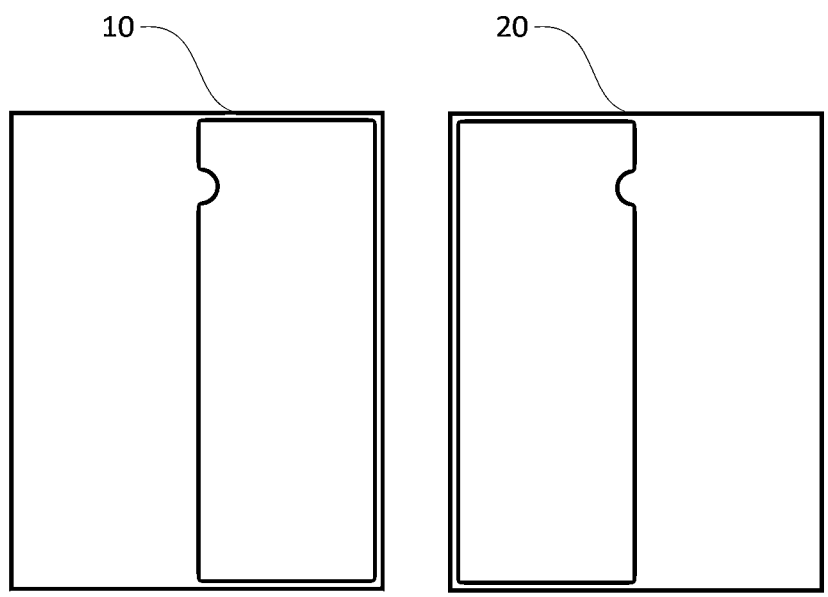
FIG. 2 is a schematic structural diagram of a mask assembly provided by an embodiment of the present disclosure.

Correspondingly, referring to FIGS. 1 and 2, an embodiment of the present disclosure also provides an evaporation mask assembly, which comprises at least two masks, wherein each mask is provided with a plurality of opening areas arranged in an array and corresponding to the display region in a one-to-one correspondence, and each opening area corresponding to a same opening area constitute complementary patterns, and the pattern formed by stitching each opening area corresponds to the display region having an isolated hollow pattern. The at least two masks comprised in the evaporation mask assembly can be used for evaporation of the base substrate.

For ease of understanding, the technical solution provided by embodiments of the present disclosure will be described in detail below through the mask including the first mask 10 and the second mask 20, that is, two masks.

Referring to FIG. 2, when the above-mentioned mask of embodiments of the present disclosure is specifically implemented, the mask may comprise a first mask 10 and a second mask 20, wherein the first mask 10 has a first type of opening area corresponding to the display region in a one-to-one correspondence (shown as blank areas in FIG. 2), and the second mask 20 have a second type of opening area corresponding to the display region in a one-to-one correspondence (shown as hatched areas in FIG. 2), and the first type of opening area and the second type of opening area corresponding to a same opening area are complementary patterns, and the pattern formed by stitching the first type of opening area and the second type of opening area corresponds to the display region having the isolated hollow pattern.

Taking the pattern formed by stitching the first type of opening area and the second type of opening area being the through hole pattern of the light transmitting area in the display region as an example, the pattern formed by stitching the first type of opening area and the second type of opening area is circular, such as shown in FIG. 2. The first type of opening area and the second type of opening area in FIG. 2 are the areas that need to be blocked, and the area on the mask other than the first type of opening area or the second type of opening area is the evaporation area, that is, the area for which the evaporation material is needed.

Figure 3:
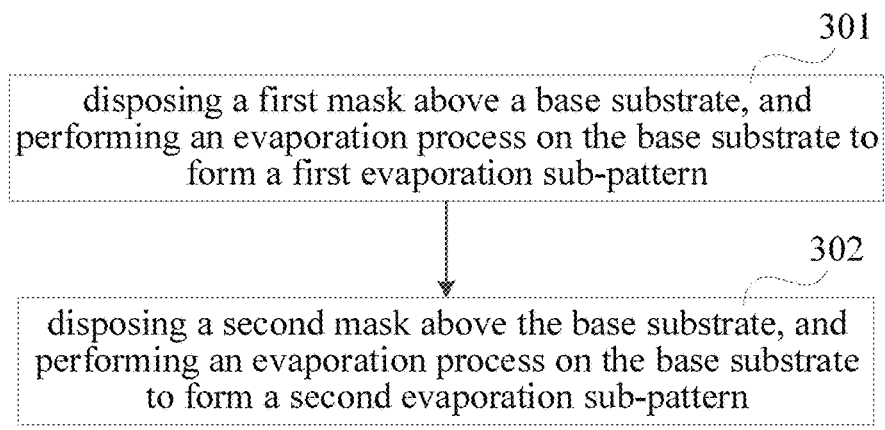
FIG. 3 is a schematic structural diagram of a mask assembly provided by an embodiment of the present disclosure.
Figure 4:
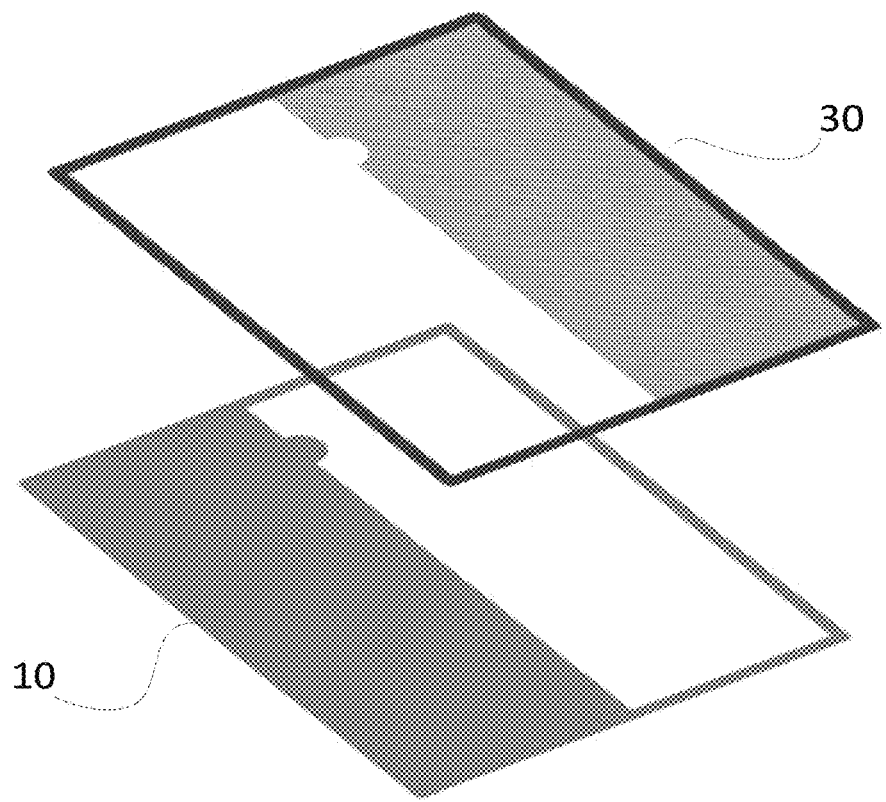
FIG. 4 is a schematic diagram of an evaporation process provided by an embodiment of the present disclosure.
Figure 4:
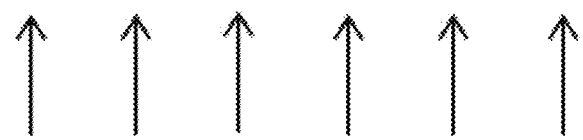
Figure 5:
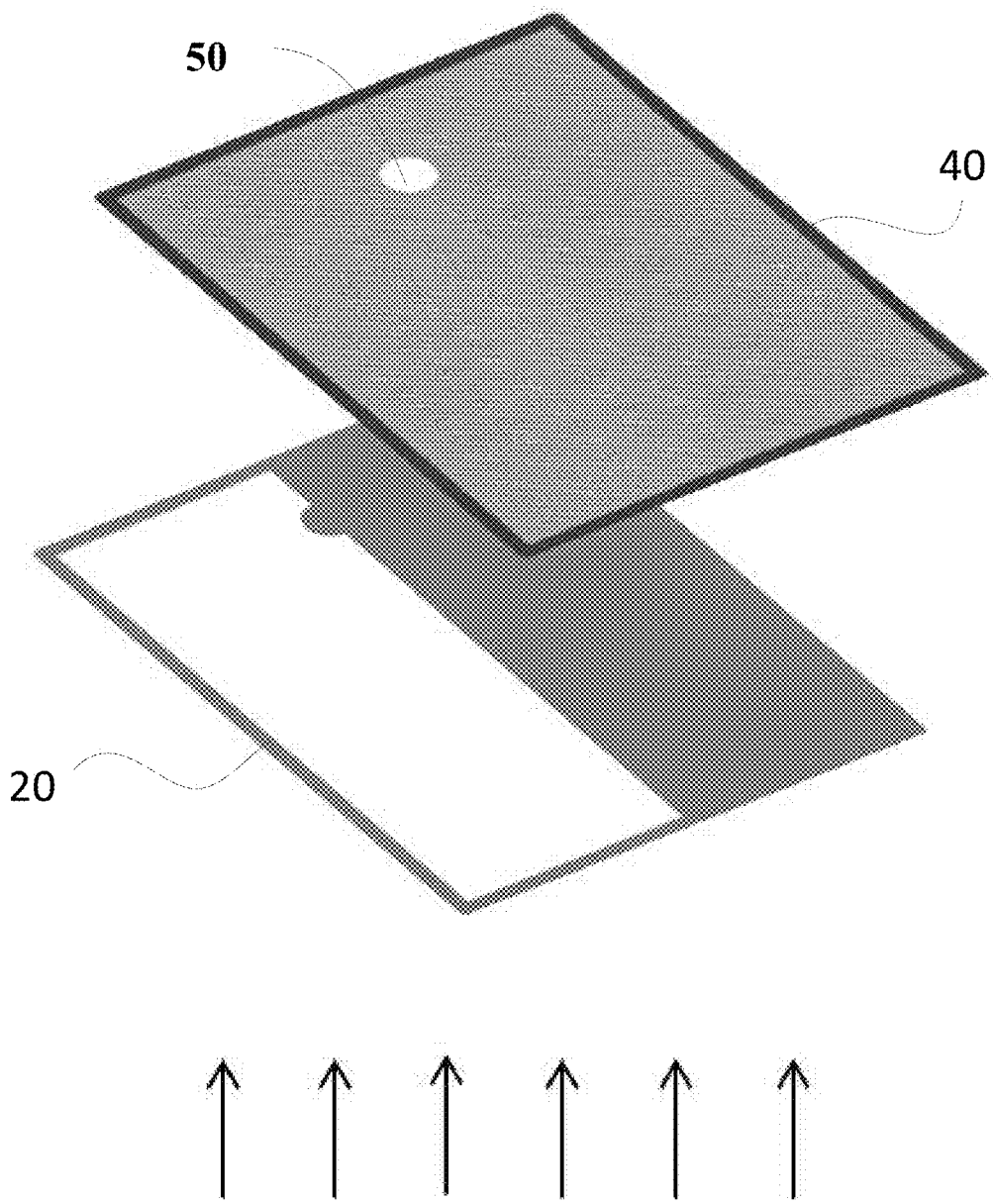
FIG. 5 is a schematic diagram of an evaporation process provided by an embodiment of the present disclosure.

Referring to FIG. 3, in combination with FIG. 4 and FIG. 5, embodiments of the present disclosure shown in FIG. 3 uses a mask as shown in FIG. 2 to perform evaporation on a base substrate. The specific process is described as follows.

As shown in FIG. 4, in step S301, a first mask 10 is disposed above the base substrate, and an evaporation process is performed on the base substrate to form a first evaporation sub-pattern 30. In FIG. 4, the arrow direction represents the light incident direction of the evaporation source.

As shown in FIG. 5, in step S302, a second mask 20 is disposed above the base substrate, and an evaporation process is performed on the base substrate to form a second evaporation sub-pattern 40. In FIG. 5, the arrow direction represents the light incident direction of the evaporation source.

The first type of opening area of the first mask 10 and the second type of opening area of the second mask 20 are arranged to be complementary patterns, and the pattern formed by stitching the first type of opening area and the second type of opening area is a circle shape 50, which corresponds to the display region having an isolated hollow pattern, and forms a light-transmitting area, thereby achieving the purpose of forming the light-transmitting area on the display panel without adding a processes, and reducing the complexity of the manufacturing process of the display panel.

It should be noted that embodiments of the present disclosure do not limit the shape of the first type of opening area of the first mask 10 or the shape of the second type of opening area of the second mask 20, as long as the complementary pattern formed by the first type of opening area and the first type and the second-type of opening area may correspond to the display region having the isolated hollow pattern. In embodiments of the present disclosure, the first type of opening area and the second type of opening area corresponding to a same opening area have opposite patterns.

Since the area on the base substrate to be evaporated is masked only once in the evaporation process, and the area which should be blocked are masked both, that is, masked twice, which may result in the thickness of the material deposited at adjacent edges of the first type of opening area and the second type of opening area corresponding to a same opening area may be thicker than that of the other areas. Thus, lengths of the adjacent edges of the first type of opening area and the second type of opening area corresponding to a same opening area are as short as possible.

Figure 6:
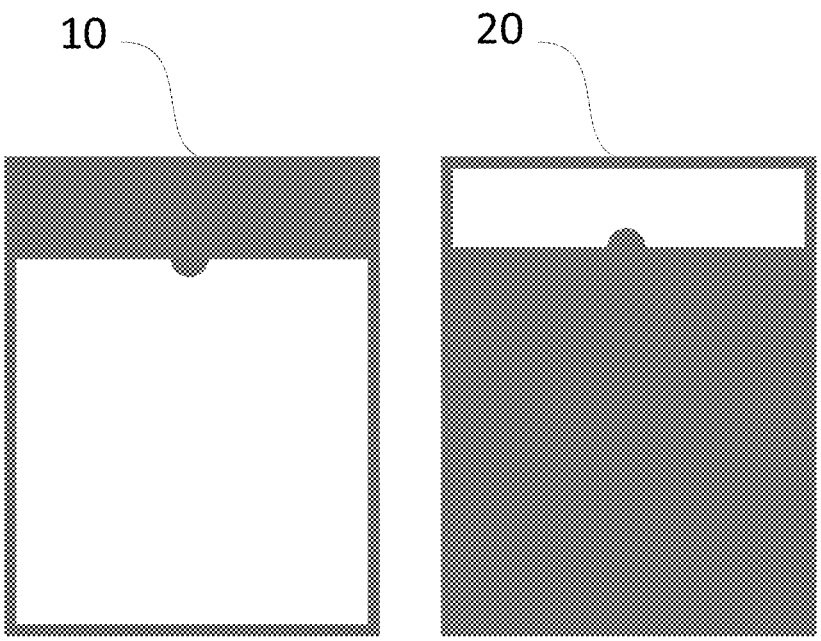
FIG. 6 is a schematic structural diagram of a mask assembly provided by an embodiment of the present disclosure.
Figure 7:
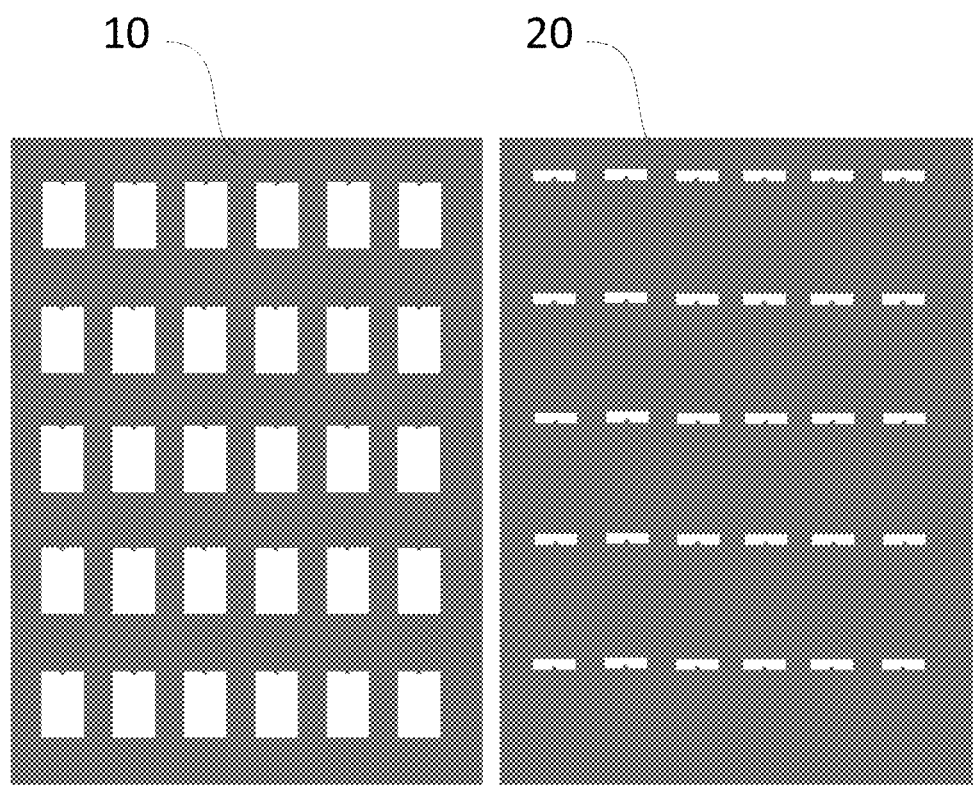
FIG. 7 is a schematic structural diagram of a mask assembly provided by an embodiment of the present disclosure.

In a possible implementation, referring to FIG. 6, a possible implementation of the first mask 10 and the second mask 20 is provided. The first type of opening area may be the opening area on the first mask 10 shown on the left side of FIG. 6, and the second type of opening area may be the opening area on the second mask 20 as shown on the right side of FIG. 6. Preferably, compared to the first mask 10 and the second mask 20 shown in FIG. 2, in the first mask 10 and the second mask 20 shown in FIG. 6, the lengths of the adjacent edges of the first type of opening and the second type of opening area are shorter. The evaporation mask assembly corresponding to the first mask 10 and the second mask 20 shown in FIG. 6 is shown in FIG. 7.

Figure 8:
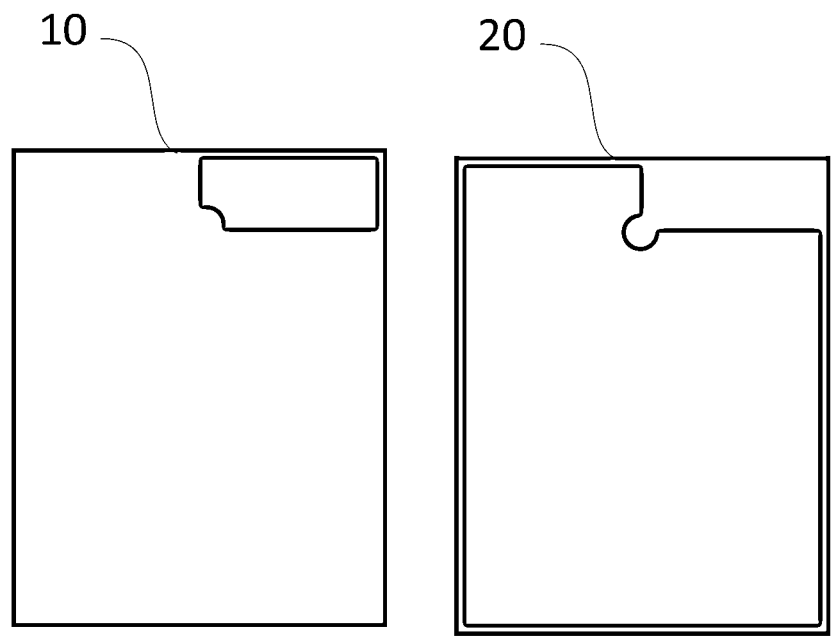
FIG. 8 is a schematic structural diagram of a mask assembly provided by an embodiment of the present disclosure.

In a possible implementation, referring to FIG. 8, another possible implementation of the first mask 10 and the second mask 20 is provided. The first type of opening area may be the opening area on the mask 10 as shown on the left side of FIG. 8, and the second type of opening area may be the opening area on the second mask 20 as shown on the right side of FIG. 8. Preferably, compared to the first mask 10 and the second mask 20 shown in FIG. 7, in the first mask 10 and the second mask 20 shown in FIG. 8, the lengths of the adjacent edges of the first type of opening area and the second type of opening area are shorter.

Figure 9:
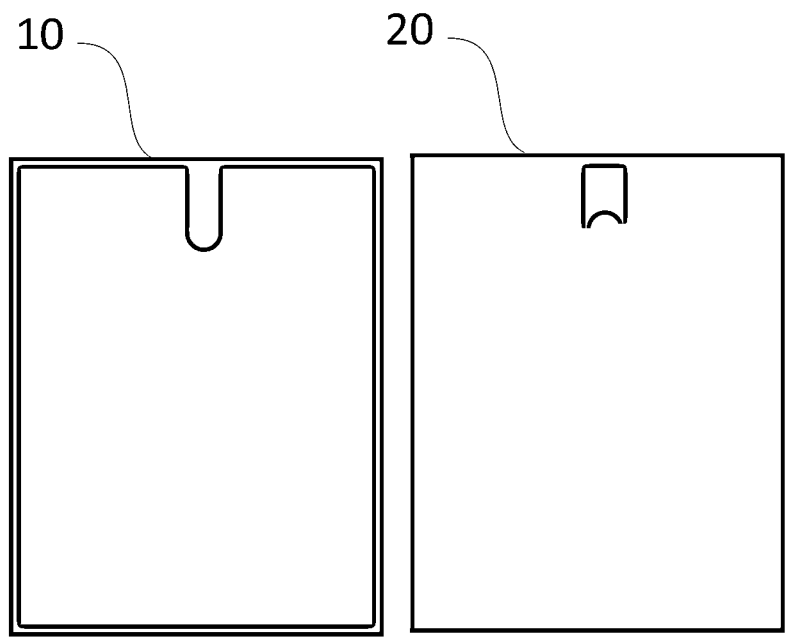
FIG. 9 is a schematic structural diagram of a mask assembly provided by an embodiment of the present disclosure.

In a possible implementation, referring to FIG. 9, another possible implementation of the first mask 10 and the second mask 20 is provided. The first type of opening area may be the first opening area on the mask 10 as shown on the left side of FIG. 9, the second type of opening area may be the opening area on the second mask 20 as shown on the right side of FIG. 9. Preferably, compared to the first mask 10 and the second mask 20 shown in FIG. 8, in the first mask 10 and the second mask 20 shown in FIG. 8, the length of the adjacent edges of the first type of opening area and the second type of opening area are shorter.

In order to make thicknesses of the materials deposited at the adjacent edges of the first type of opening area and the second type of opening area corresponding to a same opening area as close as possible to thicknesses of the materials in other areas, in embodiments of the present disclosure, the thicknesses of the first-type of opening area and the second-type of opening area corresponding to the same opening areas at adjacent edges are greater than those at other edges.

Figure 10:
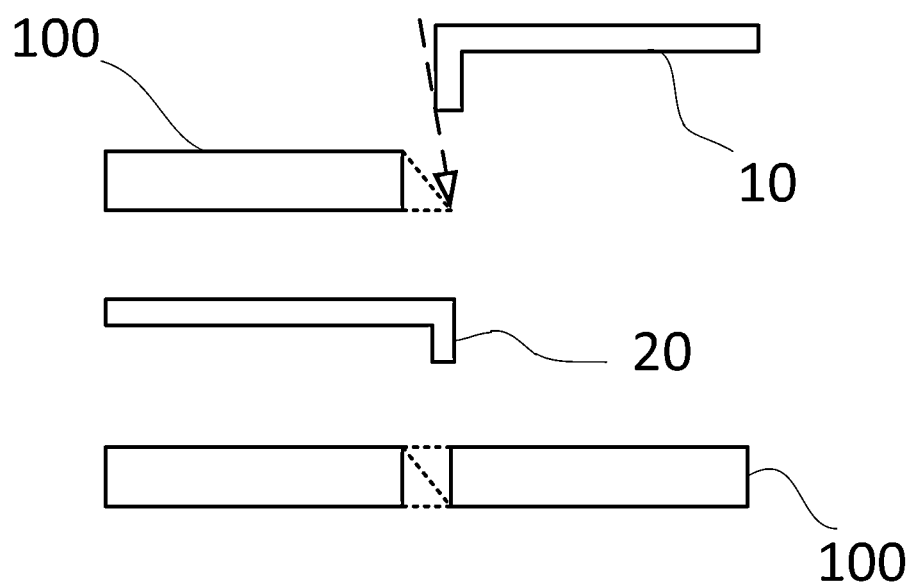
FIG. 10 is a schematic structural diagram of a mask assembly provided by an embodiment of the present disclosure.

For example, referring to FIG. 10, which is a cross-sectional view of the first mask 10 in the first-type of opening area and the second mask 20 in the second-type of opening area in the thickness direction. As can be seen from FIG. 10, when the thicknesses of the first type of opening area and the second type of opening area at the adjacent edges are greater than the thickness at the other edges, the material of the base substrate 100 that is repeatedly evaporated is shown by the broken line in FIG. 10, in order to avoid repeated evaporation in the dashed area as much as possible, wherein the arrow direction in FIG. 10 indicates the light incidence angle of the evaporation source.

It should be noted that the first type of opening area of the first mask 10 has only one opening area. Similarly, the second type of opening area on the second mask 20 also has only one opening area. In fact, the first opening areas on the first mask 10 and the second mask 20 may comprise a plurality of opening areas, as long as the complementary pattern formed by the opening areas on the first mask 10 and the opening areas on the second mask 20 matches with the display region having an isolated hollows pattern.

For example, assuming that the isolated hollow pattern in the display region is two round holes, the first mask 10 and the second mask 20 in the specific implementation comprise the following possible implementations.

Figure 11:
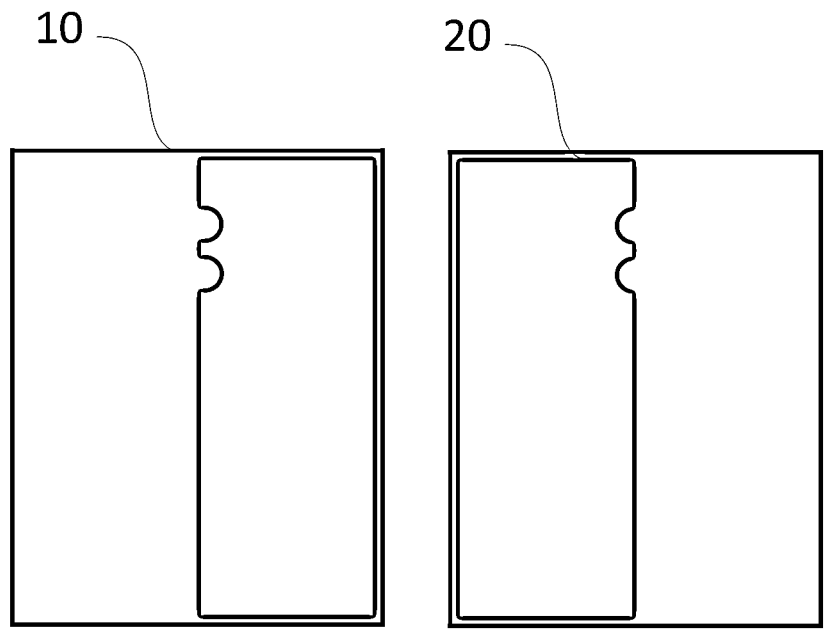
FIG. 11 is a schematic structural diagram of a mask assembly provided by an embodiment of the present disclosure.

Referring to FIG. 11, a possible implementation of the first mask 10 and the second mask 20 is provided. The first type of opening area may be an opening area on the first mask 10 as shown on the left side of FIG. 11, the second type of opening area is the opening area on the second mask 20 as shown on the right side of FIG. 11.

Figure 12:
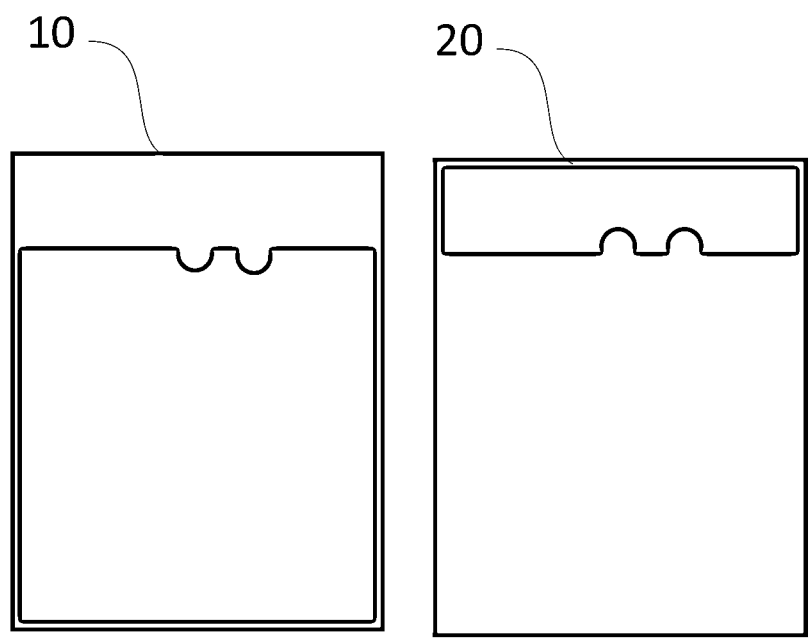
FIG. 12 is a schematic structural diagram of a mask assembly provided by an embodiment of the present disclosure.

Referring to FIG. 12, a possible implementation of the first mask 10 and the second mask 20 is provided. The first type of opening area may be an opening on the first mask 10 as shown on the left side of FIG. 12 Region, correspondingly, the second type of opening area is the opening area on the second mask 20 as shown on the right side of FIG. 12.

Figure 13:
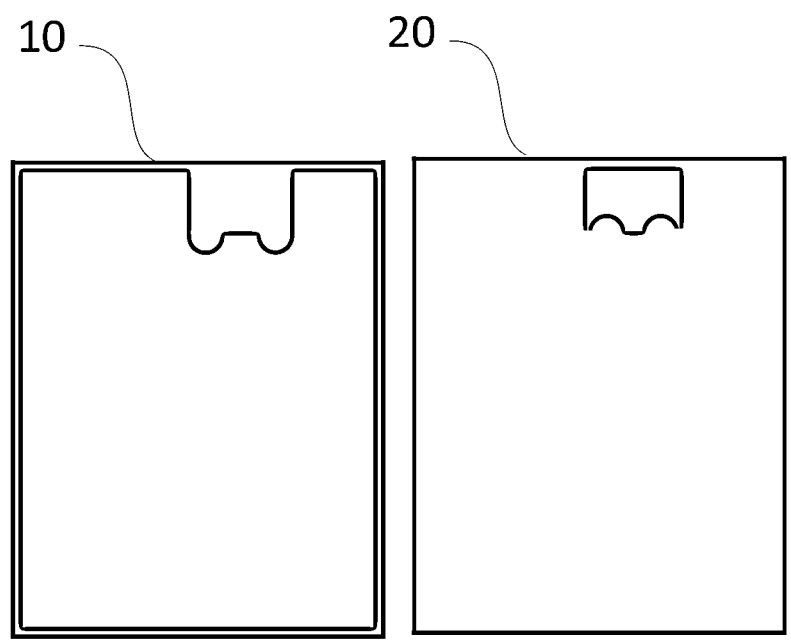
FIG. 13 is a schematic structural diagram of a mask assembly provided by an embodiment of the present disclosure.

Referring to FIG. 13, a possible implementation of the first mask 10 and the second mask 20 is provided. The first type of opening area may be an opening area on the first mask 10 as shown on the left side of FIG. 13, the second type of opening area is the opening area on the second mask 20 shown on the right side of FIG. 13.

In summary, according to embodiments of the present disclosure, evaporations on the base substrate are performed by using opening areas of at least two masks in sequence, wherein evaporation sub-patterns formed on the base substrate by opening areas of each of the masks form a complementary patterns, the complementary pattern correspond to a display region having an isolated hollow pattern, thereby achieving the purpose of forming the light-transmitting area on the display panel without requiring additional process, and reducing the complexity of the manufacturing process of the display panel.

It should also be understood that the present disclosure also contemplates the following implementations.

According to an aspect of the present disclosure, there is provided an evaporation method, comprising: performing a first evaporation on a base substrate by using a first mask to form a first evaporation sub-pattern on the base substrate, wherein the first mask has a first opening area; and performing a second evaporation on the base substrate by using a second mask to form a second evaporation sub-pattern on the base substrate, wherein the second mask has a second opening area; wherein the combination of the first and second evaporation sub-patterns forms an evaporation pattern.

In some embodiments, the first and second evaporation sub-patterns constitute complementary patterns.

In some embodiments, the evaporation pattern formed by the combination of the first and second evaporation sub-patterns corresponds to a display region having the isolated hollow pattern.

In some embodiments, a vertical projection of the first mask on the base substrate when the first evaporation is performed and a vertical projection of the second mask on the base substrate when the second evaporation is performed have overlapping portions, the overlapping portions are associated with the first opening area and the second opening area respectively.

In some embodiments, the evaporation pattern formed by the combination of the first and second evaporation sub-patterns has an isolated opening, and at least a part of the isolated opening correspond to the overlapping portions.

In some embodiments, an evaporation angle of an evaporation source corresponding to the first mask when the first evaporation is performed is different from the evaporation angle of the evaporation source corresponding to the second mask when the second evaporation is performed.

In some embodiments, the evaporation method further comprises: performing a third evaporation on the base substrate with a third mask to form a third evaporation sub-pattern on the base substrate, wherein the third mask has a third opening area; wherein the combination of the first, second and third evaporation sub-patterns forms the evaporation pattern.

According to an aspect of the present disclosure, there is provided an evaporation mask assembly including at least two masks, wherein each of the masks is provided with at least one opening area, wherein corresponding opening areas of the at least two masks constitute complementary patterns, and the combination of the corresponding opening areas of the at least two masks can be used to form an evaporation layer having an isolated hollow pattern.

In some embodiments, the at least two masks comprise a first mask and a second mask; the first mask has a first opening area, and the second mask has a second opening area corresponding to the first opening area, the first opening area and the second opening area constitute complementary patterns, and the combination of the first opening area and the second opening area can be used to form an evaporation layer having an isolated hollow pattern.

In some embodiments, a thickness of each of the corresponding opening areas of the at least two masks at edges adjacent to each other is greater than thickness thereof at other edges.

In some embodiments, the corresponding first opening area and the second opening area have opposite patterns.

In some embodiments, the evaporation mask assembly is configured such that when the evaporation mask assembly is used to perform evaporations on a base substrate, a vertical projection of the first mask on the base substrate and a vertical projection of the second mask on the base substrate have overlapping portions, and the overlapping portions are associated with the first opening and the second opening area respectively.

In some embodiments, the overlapping portions are such that the evaporation pattern formed by performing the evaporations on the base substrate by using the evaporation mask assembly has an isolated opening.

According to an aspect of the present disclosure, there is provided a display panel comprising a base substrate and a evaporation film layer formed on the base substrate, wherein the evaporation film layer is formed by adopting the evaporation method according to any of the embodiments described.

In some embodiments, the evaporation film layer comprises one or more of: a light emitting layer, an electron transport layer, or a hole transport layer.

In some embodiments, the evaporation film layer has at least one isolated hollow pattern.

According to an aspect of the present disclosure, there is provided a display device comprising the display panel according to any of the embodiments described.

Based on the same inventive idea, an embodiment of the present disclosure also provides a display panel, including a base substrate and a evaporation film layer formed on the base substrate, wherein the evaporation film layer is formed by adopting the evaporation method described above. In a possible embodiment, the evaporation film layer comprises a light-emitting layer, an electron transport layer, or a hole transport layer, and the evaporation film layer has at least one isolated hollow pattern. It can be understood that the display region of the display panel may comprise at least one pixel unit, so that the display panel can be applied to both the conventional display field and the micro display technology field. The display region of the display panel has isolated hollow pattern, which can be used to make light-transmitting areas, such as installing cameras, etc. The display panel can be: mobile phones, tablet computers, televisions, monitors, notebook computers, digital cameras, navigators, smart watches, fitness wristbands, personal digital assistants, any product or component with display function such as self-service deposit/withdrawal machine. Other indispensable components of the display panel should be understood by those of ordinary skill in the art, and will not be repeated here, nor should it be used as a limitation to the present disclosure. For the implementation of the display panel, reference may be made to the embodiments of the package structure described below.

Based on the same inventive idea, an embodiment of the present disclosure also provides a display device, including any one of the above-mentioned display panels provided by embodiments of the present disclosure. The display device may be any product or component with a display function, such as a mobile phone, a tablet computer, a television, a display, a notebook computer, a digital photo frame, a navigator, and the like. For the implementation of the display device, reference may be made to the above embodiments of the display panel, and is not repeated here.

Obviously, those skilled in the art can make various modifications and variations to the present disclosure without departing from the spirit and scope of the present disclosure. In this way, if these modifications and variations of the present disclosure fall within the scope of the claims of the present disclosure and equivalent technologies thereof, the present disclosure is also intended to comprise these modifications and variations.

What is claimed is:

1. An evaporation method, comprising:
performing a first evaporation on a base substrate by using a first mask to form a first evaporation sub-pattern on the base substrate, wherein the first mask has a first opening area; and
performing a second evaporation on the base substrate by using a second mask to form a second evaporation sub-pattern on the base substrate, wherein the second mask has a second opening area;
wherein a combination of the first and second evaporation sub-patterns forms an evaporation pattern;
wherein the first and second evaporation sub-patterns constitute complementary patterns; and
wherein the first and second evaporation sub-patterns are able to form an evaporation layer having an isolated hollow pattern.

2. The evaporation method according to claim 1, wherein the evaporation pattern formed by the combination of the first and second evaporation sub-patterns corresponds to a display region having an isolated hollow pattern.

3. The evaporation method according to claim 1, wherein a vertical projection of the first mask on the base substrate when the first evaporation is performed and a vertical projection of the second mask on the base substrate when the second evaporation is performed have overlapping portions, the overlapping portions are associated with the first opening area and the second opening area respectively.

4. The evaporation method according to claim 3, wherein the evaporation pattern formed by the combination of the first and second evaporation sub-patterns has an isolated opening, and at least a part of the isolated opening corresponds to the overlapping portions.

5. The evaporation method according to claim 1, wherein an evaporation angle of an evaporation source corresponding to the first mask when the first evaporation is performed is different from an evaporation angle of the evaporation source corresponding to the second mask when the second evaporation is performed.

6. The evaporation method of claim 1, further comprising:
performing a third evaporation on the base substrate with a third mask to form a third evaporation sub-pattern on the base substrate, wherein the third mask has a third opening area;
wherein the combination of the first, second and third evaporation sub-patterns forms the evaporation pattern.

7. A display panel comprising a base substrate and an evaporation film layer formed on the base substrate, wherein the evaporation film layer is formed by adopting the evaporation method according to claim 1.

8. The display panel according to claim 7, wherein the evaporation film layer comprises one or more of: a light emitting layer, an electron transport layer, or a hole transport layer.

9. The display panel according to claim 7, wherein the evaporation film layer has at least one isolated hollow pattern.

10. A display device comprising the display panel according to claim 7.

11. The display device according to claim 10, wherein the evaporation film layer comprises one or more of: a light emitting layer, an electron transport layer, or a hole transport layer.

12. The display device according to claim 10, wherein the evaporation film layer has at least one isolated hollow pattern.

* * * * *